INVENTOR.
ALFRED S. KHOURI
HOWARD U. TAYLOR
BY John W. Michael
ATTORNEY

United States Patent Office 3,256,499

Patented June 14, 1966

3,256,499

RESISTANCE-CAPACITANCE NETWORK UNIT

Alfred S. Khouri, Milwaukee, and Howard U. Taylor, Thiensville, Wis., assignors to Globe-Union Inc., Milwaukee, Wis., a corporation of Delaware Filed July 26, 1962, Ser. No. 214,446
18 Claims. (Cl. 333—79)

This is a continuation-in-part of our prior co-pending application Serial No. 143,198, filed October 5, 1961.

This invention relates to electrical circuit units employing a solid dielectric body having portions of varying electrical characteristics such as a high dielectric constant semi-conductor portion with a barrier layer, and a low dielectric constant portion. Units of this type have appliation as resistance capacitance networks which can be custom tailored for many special applications, including transistor circuits usable in conventionally wired chassis or with printed wiring boards.

The object of this invention is to provide such a unit which: is miniature in size while having the usual and required values; can be readily incorporated into a variety of electronic circuits, for example bypass and filter circuits, with efficient performance, reliability and economy; and may be used under applied voltage having combined A.C. and D.C. components.

Such object is obtained by employing a solid dielectric base member, plate or substrate, which has portions consisting of a high dielectric constant semiconductor ceramic separated by a portion of low dielectric constant nonohmic ceramic. Electrodes on the semiconductor ceramic develop therewith a nonohmic barrier layer or film which produces in miniature physical size a high value capacitor. However, a resistance of usable value can be created between the adjacent electrodes by shunting a part of the barrier layer. This resistance becomes part of the desired circuit. Thus without the addition of resistance paint or other resistance elements a calculated resistance in parallel with the capacitance may be created and adjusted which makes the unit more economical to manufacture, test and adjust. The value of this so called created resistance is proportional to voltage applied and the capacitance developed, but it may be readily adjusted at the area created by applying solder tinning to or abrading adjacent portions of the electrodes constituting the capacitor to short out part of the barrier layer to the extent desired.

Another object of this invention is to provide ceramic materials for use as the high dielectric constant semiconductor ceramic and the low dielectric constant nonohmic ceramic.

In order to illustrate this invention and demonstrate its characteristics one specific resistance-capacitance network unit was selected and is shown in the drawings, in which.

Figure 4:
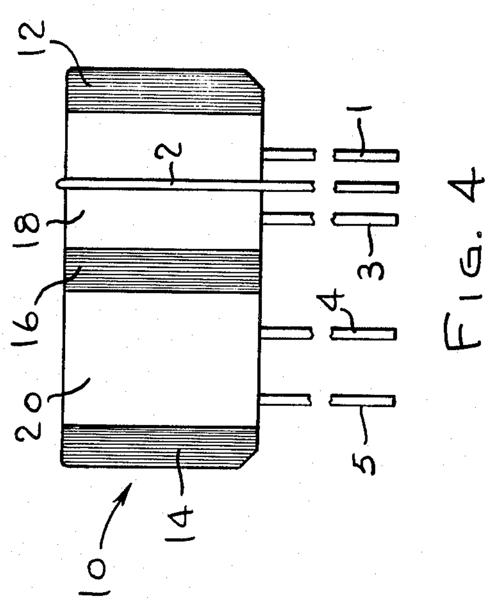
FIG. 4 is a rear plan view of the unit shown in FIG. 1.

Referring to the drawings by reference numeral the resistance-capacitance or coupling network shown therein includes a ceramic base plate or substratum 10 consisting of an integral composite member having end portions 12, 14 and a middle portion 16 (all shown line shaded) formed of a high dielectric constant reduced titanate semiconductor ceramic material and intervening coplanar portions 18 and 20 consisting of two low dielectric constant nonohmic ceramic portions. Ceramic bodies characterized by having adjacent coplanar portions of different electrical characteristics are described and claimed in U.S. Patent 2,794,940 issued June 4, 1957, to the assignor of this application. Certain of the low K ceramic mixes described in such patent may be employed in the manufacture of the composite base plate 10, as could other ceramic mixes as will be more fully described hereinafter. However, the ceramic composition used in the reduced titanate portions 12, 14 and 16, compatible with the low K portions 18 and 20, is unique and different from the high K ceramic mixes shown in such patent, particularly in the addition of a predetermined amount of rare earth oxides. The ceramic composition of the line shaded portions 12, 14 and 16 is a reduced titanate substantially of the nature described and claimed in U.S. Patent 2,841,-508 issued on July 1, 1958, to the assignee of this application. Examples of compositions for the semiconductor, or high K, portions which have given satisfactory results are as follows:

TABLE I

| Material | Percent | | | | | |
|---|---|---|---|---|---|---|
| | 1 | 2 | 3 | 4 | 5 | 6 |
| $BaTiO_3$ | 84.5 | 89 | 68 | 60 | 66 | 70.5–71.0 |
| $CaTiO_3$ | ------- | ------- | 7 | 15 | 10 | 7.3 |
| $SrTiO_3$ | 15 | ------- | 15 | 25 | 12 | 9 |
| $MgZrO_3$ | ------- | 1.0 | ------- | ------- | ------- | .7 |
| $BaZrO_3$ | ------- | ------- | 10 | ------- | ------- | 11.5–12 |
| $CaZrO_3$ | ------- | 10 | ------- | ------- | ------- | ------- |
| $PbTiO_3$ | ------- | ------- | ------- | ------- | 2.0 | ------- |
| Rare Earth Oxides | .5 | .5 | .5 | .5 | .5 | .5 |

Portions 12, 14 and 16 made of these compositions possess the electrical characteristics necessary to function as the semiconductor or high K members while being compatible with the low K portions. As can be seen, the particular composition can be varied considerably while maintaining acceptable electrical characteristics; however, it will be noted that each of the examples contain barium titanate ($BaTiO_3$) and an amount of rare earth oxides. The other materials calcium titanate ($CaTiO_3$), strontium titanate ($SrTiO_3$)), magnesium zirconate ($MgZrO_3$), barium zirconate ($BaZrO_3$), calcium zirconate ($CaZrO_3$), and lead titanate ($PbTiO_3$) are added as desired. In practice it has been found that satisfactory results can be obtained from ceramic mixes comprising the following materials within the ranges indicated:

*Table II*

| Material: | Percent |
|---|---|
| $BaTiO_3$ | 60–90 |
| $CaTiO_3$ | 0–25 |
| $SrTiO_3$ | 0–25 |
| $MgZrO_3$ | 0–1 |
| $BaZrO_3$ | 0–18 |
| $CaZrO_3$ | 0–13 |
| $PbTiO_3$ | 0–5 |
| Rare earth oxides | 0.2–1.2 |

With regard to the rare earth oxide, preferably 0.5% is used, however, satisfactory results are obtainable utilizing amounts within the range indicated. It will be appreciated that the particular ingredients of the mix and their amounts are selected so as to produce certain desired electrical characteristics, capacitance, power factor and resistance, and desired values thereof.

Examples of low K ceramic mixes for portions 18 and 20 which are compatible with the above compositions are as follows:

TABLE III

| Material | Percentage | | | | |
|---|---|---|---|---|---|
| | 1 | 2 | 3 | 4 | 5 |
| $BaTiO_3$ | 3 | 44 | 56 | 65 | 71 |
| $CaTiO_3$ | 77 | 36 | 21.5 | 18 | 7.3 |
| $SrTiO_3$ | ---------- | ---------- | 16.5 | ---------- | 9 |
| $MgZrO_3$ | 2 | 2 | .5 | 1 | .7 |
| $BaZrO_3$ | 18 | 18 | 5.5 | 14 | 12 |
| $CaZrO_3$ | ---------- | ---------- | ---------- | 2 | ---------- |

Portions 18 and 20 made of the above compositions are compatible with the high K materials of Table I and, after firing which is described hereinafter, have exhibited the electrical characteristics necessary to function as the low K members. As can be seen in Table III, the particular composition of the low K ceramic mixes can be varied considerably while maintaining acceptable electrical characteristics, and satisfactory results have been achieved from using mixes wherein the materials fall within the following range:

*Table IV*

| Materal: | Percent |
|---|---|
| $BaTiO_3$ | 0–71 |
| $CaTiO_3$ | 7–77 |
| $MgZrO_3$ | 0.5–2 |
| $BaZrO_3$ | 5–40 |
| $SrTiO_3$ | 0–17 |
| $CaZrO_3$ | 0–10 |

It should be noted that, although the inclusion of $BaTiO_3$ is preferred, it can be eliminated if desired and still obtain satisfactory results. Again it will be appreciated that the particular ingredients and their amounts are selected so as to produce certain desired electrical characteristics, capacitance, power factor and resistance, and desired values thereof.

Particular compositions of high K and low K ceramics can be combined as desired to form a flat plate with the preferred combination being Example 6 of Table I and Example 3 of Table III. The flat plate can be formed in the manner described in Patent 2,794,940 which is fired to maturtiy in air at a temperature of about 2450° F. After such firing the line shaded portions 12 to 14 and 16 of the plate do not have the characteristics of a semiconductor, e.g. typical levels of resistivity would normally be in the order of $10^{10}$ to $10^{13}$ ohm-cm. The plate is then refired at a temperature of 2150° F. in hydrogen or a carbon monoxide containing atmosphere or other reducing atmospheres to reduce the portions 12, 14 and 16 to exhibit semiconductive characteristics throughout, e.g. the typical level of resistivity would now be in the order of 5 to 1000 ohm-cm. The low K intervening portions 18 and 20 have a dielectric constant of approximately 1300. More specifically and by way of example, using a silver oxide paint for the electrodes and the preferred combination of high and low K ceramics (namely Example 6 of Table I and Example 3 of Table III) and a test voltage of 3 and 45 volts D.C. on the high and low K ceramics, respectively, the following electrical characteristics were observed with the ceramics in a reduced state:

| | High K | Low K |
|---|---|---|
| Capacity, mf | 1.240 | .0027. |
| Dielectric constant | No calculation | 1,610. |
| Power factor, percent | 6.9 | 1.3. |
| Insulation resistance, ohms | 118 K | 10 meg. |

In the reduced state, the dielectric constant of the high K is not conveniently measurable but is believed to be considerably greater than and, in any event, at least as great as in the oxidized state which is approximately 7000.

It is desirable in some applications to keep the K of the low K portions to a minimum and to this end it has been found that a K as low as 100 to 120 can be obtained by a body which is compatible with the reduced titanate portions. An example of a ceramic mix for such a body is:

| Material: | Percent |
|---|---|
| $BaTiO_3$ | 10.0 |
| $CaTiO_3$ | 48.0 |
| $SrTiO_3$ | — |
| $MgZrO_3$ | 2.0 |
| $BaZrO_3$ | 40.0 |
| Mixture of rare earth oxides | — |

Similar to those of Table III, this low K ceramic mix also contains barium titanate, calcium titanate, magnesium zirconate and barium zirconate.

After reduction firing, the front face of the plate is then provided with silver paint electrodes in any manner known to those skilled in the capacitor art. Electrodes 22, 24 and 26 are applied to the reduced titanate portions 12, 14 and 16 and are electrically interconnected by conductors 28 and 30 applied on the low K portions 18 and 20. These electrodes and conductors may be applied as a continuous silver paint pattern on the area as shown. Electrodes 32, 34 and 36 are also applied to the reduced titanate portions 12, 14 and 16 as shown. They are coplanar with the electrodes 22, 24 and 26 and form with them (by edge effect) capacitances designated $C_1$, $C_2$ and $C_3$ in FIG. 5.

The electrodes 32, 34 and 36 are electrically connected to terminal pads 38, 40 and 42 which are silver painted on the low K portions 18 and 20 as shown. The pads may be applied with the electrodes 32, 34 and 36 as part of the same silver paint pattern. Another separate terminal pad 44 is applied to the low K portion 20 and a specified resistance strip $R_2$ (shown stippled) of carbonaceous resistance paint is screen deposited in a well known manner to the low K portion 20 interconnecting the conductor 30 and terminal pad 44. The low K portions are thus needed to form the base for the conductors and terminal pads and the substrate for the resistance strip, thus permitting proper soldered terminations.

Figure 1:
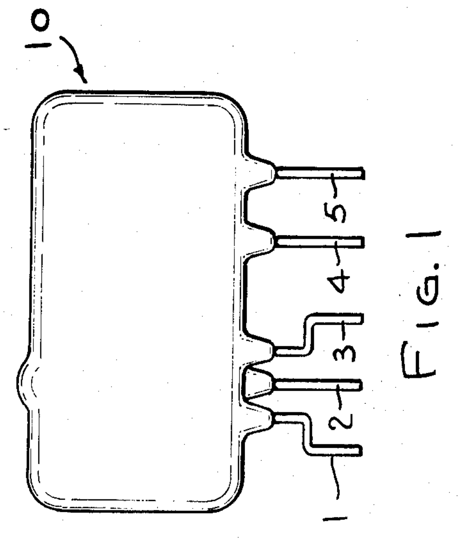
FIG. 1 is a front plan view of an electrical circuit unit embodying this invention with a coating of protective material applied thereto.

Because the capacitances $C_1$, $C_2$ and $C_3$ are formed on the semiconductor portions and have dielectrics formed by ultra thin barrier layers they each have a high capacity rating for their physical size. The encapsulated unit as shown in FIG. 1 is small having dimensions of 0.800 inch by 0.400 inch by 0.140 inch. Based on a typical operating voltage of 0.5 volt these capacitors have values of from 0.01 mf. to 2.0 mf. and the resistance $R_2$ is rated at approximately 10,000 ohms.

Figure 5:
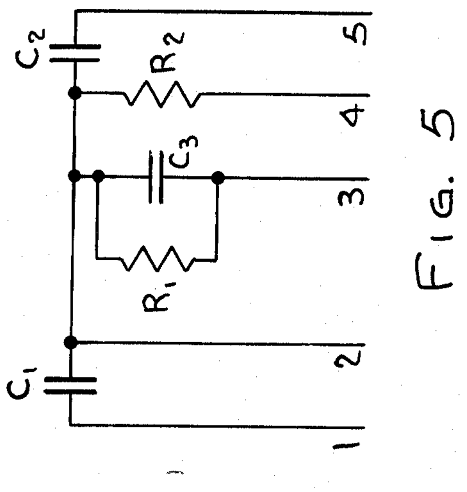
FIG. 5 is a schematic circuit diagram of the unit of FIGS. 1 to 4 inclusive.
Figure 3:
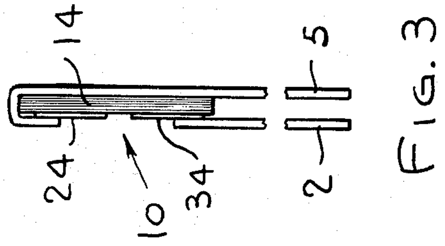
FIG. 3 is an end view of the unit shown in FIG. 2 taken from the right hand end thereof.
Figure 2:
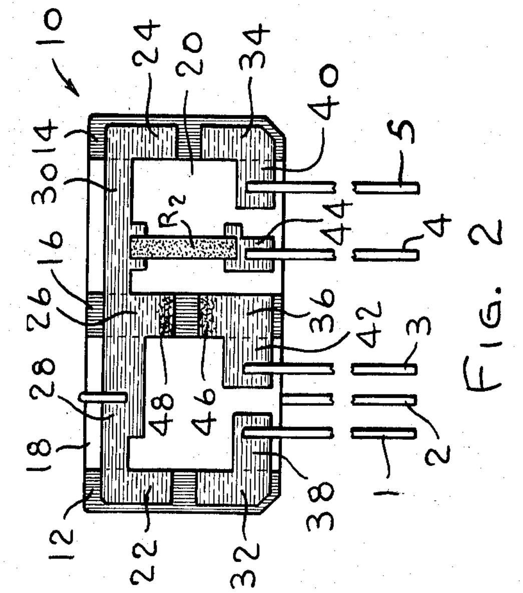
FIG. 2 is a front plan view of the unit shown in FIG. 1 before applying the protective material.

An essential characteristic of this invention is that a resistance, designated $R_1$ in FIG. 5 is created between the electrodes 26 and 36 and is adjusted by abrading part of the adjacent portions of such electrodes or by spot soldering or solder tinning the adjacent surfaces of such electrodes at the portions indicated by the cross marked areas 46 and 48. The amount of such resistance in this example is 300 ohms. However, resistances of from 20 ohms to 20 megohms may thus be obtained. This required resistance is formed without addition to the physical structure or without separate attachments and hence miniaturization is preserved and cost lessened. It is believed that the resistance is created when a part of the nonohmic barrier layer below that portion of the electrode which is abraded or solder tinned is shunted out. At such area the electrodes become metallic ohmic on semiconductor material. The value of the resistor $R_1$ can be determined by using the formula:

$$R=pL/A$$

where $p$ is the resistivity of the semiconductor material at a D.C. voltage under which the electrical resistor capacitor circuit element is to be used; L is the spacing, or geometric means spacing between the shunted area of the electrodes; and A is the average area of the two shunted areas of the capacitor electrodes providing the ohmic contacts.

The ohmic resistivity can be made and controlled in value between 50 and 1000 ohms per centimeter. By design of the capacitor electrodes and the sections of the electrodes to be shunted, and the dimensions of the semiconductor material separating the respective parts of the electrodes, the resistor and capacitor values can be predetermined.

From the foregoing it will be apparent that in handling the unit and in applying the wire lead 1 to the terminal pad 38, wire lead 2 to the conductor 28, wire lead 3 to the terminal pad 42, wire lead 4 to the terminal pad 44, and wire lead 5 to the terminal pad 40 care must be taken not to destroy the barrier layer under the electrodes. One way to accomplish this is to place a precoat of inert paint over such electrodes. The solder during the dip bath attachment of the wire leads will not adhere to such precoat and will thus not affect the barrier layer. Such precoat will also protect the electrodes from abrasion during handling in subsequent operations. The unit when completed is encapsulated in an insulating coating in the usual manner.

We claim:

1. An electrical circuit unit having a composite unitary fired ceramic body of united masses of ceramic of different electrical properties at least one of which consists of reduced titanates having the properties of a semiconductor and another of which consists of a low dielectric constant nonohmic ceramic, electrodes on said mass of reduced titanates forming a capacitor utilizing a barrier layer dielectric beneath said electrodes, and conductive films on said mass of nonohmic ceramic electrically connected to said electrodes.

2. An electrical circuit unit as claimed in claim 1 in which a resistance of useful value is created between said electrodes by shunting an area of the barrier, said electrodes by shunting an area of the barrier layer underlying a limited area of at least one of said electrodes.

3. An electrical circuit unit as claimed in claim 2 in which said area is shunted by a mechanical abrasion on at least one of said electrodes.

4. An electrical circuit unit as claimed in claim 2 in which said area is shunted by solder tinning applied to at least one of said electrodes.

5. An electrical circuit unit as claimed in claim 2 in which said mass of reduced titanates comprises by weight percent:

| | Percent |
|---|---|
| $BaTiO_3$ | 70.5–71.0 |
| $CaTiO_3$ | 7.3 |
| $SrTiO_3$ | 9.0 |
| $MgZrO_3$ | 0.7 |
| $BaZrO_3$ | 12.0–11.5 |
| Mixture of rare earth oxides | 0.5 |

and said mass of nonohmic ceramic comprises by weight percent:

| | Percent |
|---|---|
| $BaTiO_3$ | 10.0 |
| $CaTiO_3$ | 48.0 |
| $SrTiO_3$ | — |
| $MgZrO_3$ | 2.0 |
| $BaZrO_3$ | 40.0 |
| Mixture of rare earth oxides | — |

6. An electrical circuit unit as claimed in claim 5 in which said capacitor has a value in the range of 0.01 mf. to 2.0 mf., and said resistance has a value in the range of 20 ohms to 20 megohms.

7. An electrical unit circuit as claimed in claim 1 in which said mass of reduced titanates comprises by weight percent:

| | Percent |
|---|---|
| $BaTiO_3$ | 70.5–71.0 |
| $CaTiO_3$ | 7.3 |
| $SrTiO_3$ | 9.0 |
| $MgZrO_3$ | 0.7 |
| $BaZrO_3$ | 12.0–11.5 |
| Mixture of rare earth oxides | 0.5 |

and said mass of nonohmic ceramic comprises by weight percent:

| | Percent |
|---|---|
| $BaTiO_3$ | 10.0 |
| $CaTiO_3$ | 48.0 |
| $SrTiO_3$ | — |
| $MgZrO_3$ | 2.0 |
| $BaZrO_3$ | 40.0 |
| Mixture of rare earth oxides | — |

8. An electrical circuit unit as claimed in claim 1 in which said mass of reduced titanates comprises by weight percent:

| | Percent |
|---|---|
| $BaTiO_3$ | 70.5–71.0 |
| $CaTiO_3$ | 7.3 |
| $SrTiO_3$ | 9.0 |
| $MgZrO_3$ | 0.7 |
| $BaZrO_3$ | 12.0–11.5 |
| Mixture of rare earth oxides | 0.5 |

and said mass of nonohmic ceramic comprises by weight percent:

| | Percent |
|---|---|
| $BaTiO_3$ | 56 |
| $CaTiO_3$ | 21.5 |
| $SrTiO_3$ | 16.5 |
| $MgZrO_3$ | .5 |
| $BaZrO_3$ | 5.5 |

9. An electrical circuit unit as claimed in claim 1 in which said mass of reduced titanates comprise predetermined amounts of barium titanate ($BaTiO_3$) and rare earth oxides and said mass of nonohmic ceramic comprise predetermined amounts of calcium titanate ($CaTiO_3$), magnesium zirconate ($MgZrO_3$) and barium zirconate ($BaZrO_3$).

10. An electrical circuit unit as claimed in claim 9 wherein said mass of nonohmic ceramic also includes barium titanate ($BaTiO_3$).

11. The combination of claim 10 wherein the amounts of said materials fall substantially within the following approximate ranges, said mass of reduced titanates

| | Percent |
|---|---|
| $BaTiO_3$ | 60–90 |
| Rare earth oxides | 0.2–1.2 |

and said mass of nonohmic ceramic

| | Percent |
|---|---|
| $BaTiO_3$ | 0–71 |
| $CaTiO_3$ | 7–77 |
| $MgZrO_3$ | .5–2 |
| $BaZrO_3$ | 5–40 |

12. The combination of claim 11 wherein said mass of reduced titanates also contain 0–25% $CaTiO_3$, 0–25% $SrTiO_3$, 0–1% $MgZrO_3$, 0–18% $BaZrO_3$, 0–13% $CaZrO_3$ and 0–5.0% $PbTiO_3$; and said mass of nonohmic ceramic also contains 0–17% $SrTiO_3$ and 0–10% $CaZrO_3$.

13. An electrical circuit unit having a composite unitary fired ceramic body of united masses of ceramic of different electrical properties at least one of which consists of reduced titanates having the properties of a semiconductor and another of which consists of a low dielectric constant nonohmic ceramic, electrodes on said mass of reduced titanates forming a capacitor utilizing a barrier layer dielectric beneath said electrodes, and conductive films connected to and extending from said electrodes onto said nonohmic ceramic, said conductive films terminating on said nonohmic ceramic and providing terminal connection points for said electrodes which are removed from said titanate ceramic.

14. A resistance-capacitance circuit element having a ceramic body of reduced titanate having the properties of a semiconductor, an electrode of predetermined size applied to said body to form a barrier layer dielectric beneath the entire area of said electrode and provide a capacitance utilizing said barrier layer, and a resistance in parallel with said capacitance consisting of a relatively small portion of said barrier layer shunted to destroy the nonohmic effect of said small portion and create at said small portion an ohmic connection to form said resistance.

15. The resistance-capacitance circuit element of claim 14 in which the value of said resistance at the applied D.C. voltage is dependent upon the area of said electrode and the underlying barrier layer which is shunted and the ohmic resistivity of the semiconductor portion beneath the portion of the electrode overlying the shunted barrier layer.

16. The resistance-capacitance circuit element of claim 15 including a pair of electrodes on said body, each electrode providing a capacitance utilizing a barrier layer beneath the entire area of respective ones of said electrodes and each barrier layer including a relatively small shunted portion to destroy the nonohmic effect of said small portion.

17. The resistance-capacitance circuit element of claim

14 in which said barrier layer is shunted by mechanical abrasion of a confined area of said electrode and said barrier layer corresponding to the desired portion of said barrier layer to be shunted.

18. The resistance-capacitance circuit element of claim 14 in which said barrier layer is shunted by solder tinning applied to a confined area of said electrode corresponding to the desired portion of said barrier layer to be shunted.

References Cited by the Examiner

UNITED STATES PATENTS

| | | | |
|---|---|---|---|
| 2,566,666 | 9/1951 | Khowi | 323—74 |
| 2,634,330 | 4/1953 | Gaudio | 333—79 |
| 2,637,777 | 5/1953 | Kilby | 333—79 |
| 2,648,804 | 8/1953 | Steigerwalt | 317—101 |
| 2,694,185 | 11/1954 | Kodwma | 323—74 |
| 2,794,940 | 6/1957 | Roup | 317—101 |
| 2,841,508 | 7/1958 | Roup et al. | 317—242 |
| 2,877,389 | 3/1959 | Wiener | 317—101 |
| 2,940,035 | 6/1960 | Lefkowitz | 317—256 |
| 3,109,983 | 11/1963 | Cooper et al. | 333—70 |

OTHER REFERENCES

Electronics, "Network Design," by C. K. Hager, Sept. 4, 1959, pages 44–49.

HERMAN KARL SAALBACH, *Primary Examiner.*

ELI LIEBERMAN, C. BARAFF, *Assistant Examiners.*